United States Patent [19]
Terrill

[11] Patent Number: 6,057,173
[45] Date of Patent: May 2, 2000

[54] ABLATIVE BOND PAD FORMATION

[75] Inventor: Robert Earl Terrill, Carrollton, Tex.

[73] Assignee: Texas Instruments Incorporated, Dallas, Tex.

[21] Appl. No.: 09/014,078

[22] Filed: Jan. 27, 1998

Related U.S. Application Data

[60] Provisional application No. 60/038,436, Feb. 19, 1997.

[51] Int. Cl.[7] .......................... H01L 21/44; H01L 21/48; H01L 21/82
[52] U.S. Cl. .......................... 438/106; 438/118; 438/612
[58] Field of Search .................................... 438/106, 118, 438/612

[56] References Cited

U.S. PATENT DOCUMENTS 5,306,670  4/1994  Mowatt et al. .
5,644,143  7/1997  Rostoker et al. .
5,805,421  9/1998  Livengood et al. .

*Primary Examiner*—Kevin M. Picardat
*Assistant Examiner*—D. Mark Collins
*Attorney, Agent, or Firm*—Wade James Brady, III; Frederick J. Telecky, Jr.

[57] ABSTRACT

A method of fabricating bond pads on a semiconductor device which includes providing a semiconductor device having a surface. A coating of solderable electrically conductive metal is deposited on the surface, preferably by sputtering, and portions of the coating are selectively removed by ablation or vaporization, preferably by use of a laser beam. The selective removal is accomplished by selective movement of the laser relative to the coating or by use of a mask followed by traversal of the laser beam over the entire coating. The coating is preferably a 500 angstrom layer of chromium over which is a 1500 angstrom layer of palladium followed by a 3500 angstrom layer of gold.

22 Claims, 1 Drawing Sheet

ABLATIVE BOND PAD FORMATION

This application claims priority under 35 USC 119(e)(1) of provisional application Ser. No. 60/038,436, filed Feb. 19, 1997.

BACKGROUND OF THE INVENTION

1. Field of the Invention

This invention relates to a method of forming bond pads on semiconductor devices.

2. Brief Description of the Prior Art

In the fabrication of semiconductor devices, it is necessary to provide electrically conductive, solderable and wire bondable bond pads which adhere to the surfaces of such devices to provide electrical connection between components disposed in the semiconductor device itself and other components within that semiconductor device and/or to external devices. The prior art procedures generally utilized in fabrication of such bond pads have required a generally large number of processing steps, these processing steps including sputtering the seed metal onto the semiconductor device, coating and masking a resist over the seed metal, exposing the unmasked portion of the resist to an appropriate radiation, developing the resist to remove the resist either in the location of the pattern or in all locations but the pattern, depending upon the type of resist used, plating the exposed seed metal with copper, stripping the remaining resist and then etching away the exposed seed metal.

The use of plating processes presents several problems, among these problems being the difficulty of controlling the plating process and the environmental unfriendliness of the effluent resulting from the plating process. The strip and etch waste effluents produced by the current prior art processes also present an environmentally unfriendly disposal problem. It is therefore readily apparent that other bond pad fabrication procedures which eliminate the above described unfriendly aspects of the prior art procedures are highly desirable. In addition, a bond pad fabrication procedure which required fewer processing step and/or which utilized processing procedures which are compatible with semiconductor fabrication procedures would provide a desirable economic advantage.

SUMMARY OF THE INVENTION

In accordance with the present invention, there is provided a method of fabrication of bond pads which eliminates the unfriendly aspects of the prior art methods described above and which also can be performed utilizing far fewer processing steps than are required by the prior art procedures as well as utilizing standard semiconductor processing procedures. The fabrication process in accordance with the present invention requires the formation of a thin film of electrically conductive and solderable metal and an ablative laser technique to selectively remove the metal by vaporization thereof to form the bond pads, wire bonding or soldering. This procedure uses standard semiconductor processing procedures and is clean room friendly. The present invention thereby allows bond pad creation to be performed at the front end or during the semiconductor processing procedure and thereby eliminates the requirement to send the partially fabricated device to a different location to provide the bond pad formation as is required by the prior art.

Briefly, a thin film system is substituted for the plated metal of the prior art. A thin film of electrically conductive metal or metals is formed over the surface of the semiconductor device, preferably by sputtering. The thin film can take the form of any electrically conductive material to which a solder connection can be made and which can be removed by ablation. A preferred pad chemistry includes a 500 angstrom layer of chromium over which is a 1500 angstrom layer of palladium followed by a 3500 angstrom layer of gold. Each of the layers of metal is preferably sputtered down onto the surface of the semiconductor device. A radiation capable of ablating the metal to cause vaporization of the metal, preferably a laser beam, preferably a krypton fluoride excimer laser, preferably having a frequency of about 248 nanometers, is then selectively applied to the metal to cause ablation of the metal at those regions wherein the laser beam impinges upon the metal. The selectivity can be provided in many ways such as, for example, by movement of the laser beam relative to the metal film, by use of a standard metal mask which is impervious to the laser beam or by use of a holographic phase mask. The end result is that after selective ablation or vaporization of the metal, bond pads are provided which have been fabricated using standard semiconductor processing procedures. These procedure require far fewer steps than are required by the prior art with provision of a vaporized metal effluent as opposed to the unfriendly liquid waste of the prior art which presents disposal problems. The vaporized metal, on the other hand, can be collected at the generation site in filters for recycling. In addition, the cycle time for the process in accordance with the present invention is much shorter than the plating process of the prior art.

SUMMARY OF THE INVENTION

Figure 1:
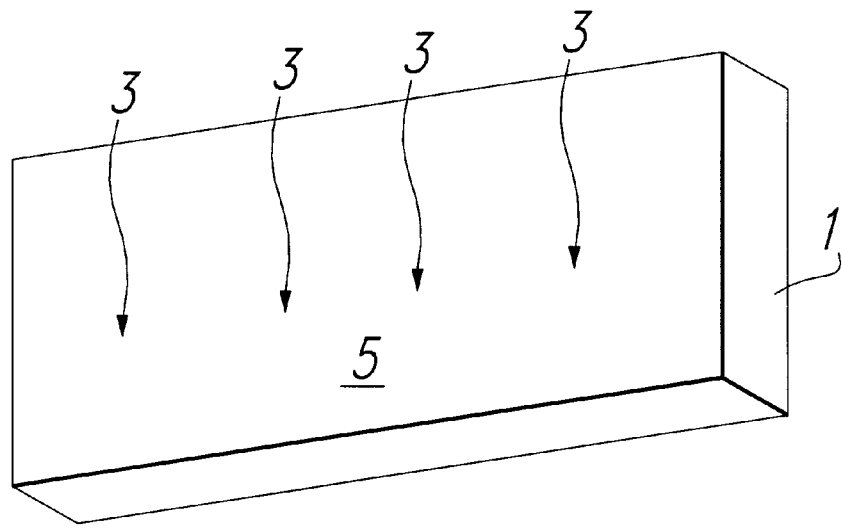
FIG. 1 is a schematic diagram showing a partially fabricated semiconductor device with a thin metal layer deposited thereon.
Figure 2:
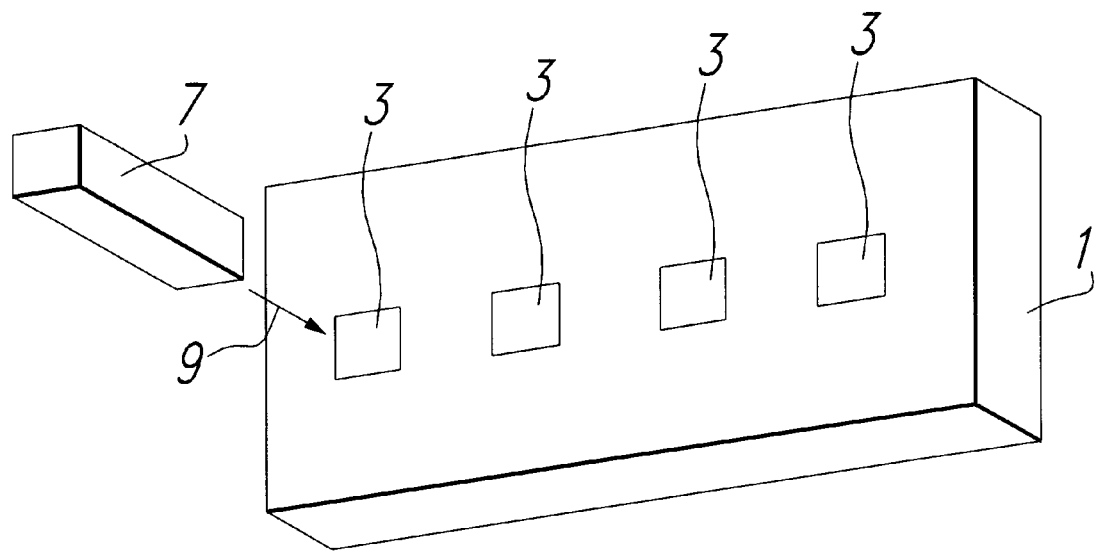
FIG. 2 shown the device of FIG. 1 after metal ablation using a laser.

Referring first to FIG. 1, there is shown a partially fabricated semiconductor device 1 having a surface with a thin film of electrically insulating material 5 previously patterned for the appropriate electrical feedthrough. A solderable metal combination 3 is sputtered onto the electrically insulating material 5 as well as over the unpatterned portion of the surface. The solderable metal combination in accordance with the preferred embodiment is a 500 angstrom layer of chromium over which is a 1500 angstrom layer of palladium followed by a 3500 angstrom layer of gold over the surface of electrically insulating material 5. Other metal combinations, as are well known, can be used in place of the preferred metal combination, the preferred metal combination being provided only by way of example. As shown in FIG. 2, a radiation 9 capable of ablating or vaporizing the metal from a krypton fluoride excimer laser 7 having a frequency of about 248 nanometers is then selectively applied to the metal 3 to cause ablation of the metal at those regions wherein the laser beam 9 impinges upon the metal. The selectivity is provided by use of a standard metal mask (not shown) which would be located in the regions shown in FIG. 2 whereat the metal 3 remains in conjunction with movement of the laser beam over the surface of the semiconductor device 1 to ablate or vaporize only the exposed metal. The end result is that bond pads are provided using standard semiconductor processing procedures with far fewer required steps than are required by the prior art. This bond pad fabrication process provides a vaporized metal effluent as opposed to the unfriendly liquid waste of the prior art which presents disposal problems. The vaporized metal, on the other hand, can be collected at the generation site in filters for recycling. In addition, the cycle time for the process in accordance with the present invention is much shorter than the plating process of the prior art.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating bond pads on a semiconductor device which comprises the steps of:
   (a) providing a semiconductor device having a surface;
   (b) forming a coating of solderable electrically conductive metal on said surface; and
   (c) selectively removing portions of said coating from said surface by ablation to form said bond pads.

2. The method of claim 1 which said step of forming comprises the step of sputtering said metal onto said surface.

3. The method of claim 1 wherein said coating comprises a layer of chromium over which is a layer of palladium followed by a layer of gold.

4. The method of claim 2 wherein said coating comprises a layer of chromium over which is a layer of palladium followed by a layer of gold.

5. The method of claim 3 wherein said layer of chromium is about 500 angstroms, said layer of nickel is about 1500 angstroms and said layer of gold is about 3500 angstroms.

6. The method of claim 4 wherein said layer of chromium is about 500 angstroms, said layer of nickel is about 1500 angstroms and said layer of gold is about 3500 angstroms.

7. The method of claim 1 wherein said step of selectively removing said coating comprises vaporization of said coating.

8. The method of claim 6 wherein said step of selectively removing said coating comprises vaporization of said coating.

9. The method of claim 1 wherein said step of selectively removing said coating comprises the steps of selectively applying a laser beam to said coating.

10. The method of claim 6 wherein said step of selectively removing said coating comprises the steps of selectively applying a laser beam to said coating.

11. The method of claim 7 wherein said step of selectively removing said coating comprises the steps of selectively applying a laser beam to said coating.

12. The method of claim 8 wherein said step of selectively removing said coating comprises the steps of selectively applying a laser beam to said coating.

13. The method of claim 9 wherein said step of selectively removing said coating further comprises the step of masking said coating prior to applying said laser beam.

14. The method of claim 10 wherein said step of selectively removing said coating further comprises the step of masking said coating prior to applying said laser beam.

15. The method of claim 11 wherein said step of selectively removing said coating further comprises the step of masking said coating prior to applying said laser beam.

16. The method of claim 12 wherein said step of selectively removing said coating further comprises the step of masking said coating prior to applying said laser beam.

17. The method of claim 9 wherein said step of selectively removing said coating further comprises the step of moving said laser beam selectively relative to said coating.

18. The method of claim 10 wherein said step of selectively removing said coating further comprises the step of moving said laser beam selectively relative to said coating.

19. The method of claim 11 wherein said step of selectively removing said coating further comprises the step of moving said laser beam selectively relative to said coating.

20. The method of claim 12 wherein said step of selectively removing said coating further comprises the step of moving said laser beam selectively relative to said coating.

21. The method of claim 13 wherein said step of masking involves the step of providing a holographic phase mask.

22. The method of claim 16 wherein said step of masking involves the step of providing a holographic phase mask.

* * * * *